United States Patent [19]

Rosenzweig

[11] 4,284,905

[45] Aug. 18, 1981

[54] IGFET BOOTSTRAP CIRCUIT

[75] Inventor: Walter Rosenzweig, Allentown, Pa.

[73] Assignee: Bell Telephone Laboratories, Incorporated, Murray Hill, N.J.

[21] Appl. No.: 44,397

[22] Filed: May 31, 1979

[51] Int. Cl.³ .............. H03K 19/094; H03K 19/003; H03K 19/20
[52] U.S. Cl. .................... 307/482; 307/270; 307/DIG. 4; 307/DIG. 5
[58] Field of Search .............. 307/205, 214, 251, 270, 307/DIG. 4, DIG. 5

[56] References Cited

U.S. PATENT DOCUMENTS

| | | | |
|---|---|---|---|
| 3,506,851 | 4/1970 | Polkinghorn et al. | 307/251 |
| 3,649,843 | 3/1972 | Redwine et al. | 307/251 |
| 3,774,055 | 11/1973 | Bapat | 307/DIG. 4 X |
| 3,805,095 | 4/1974 | Lee et al. | 307/DIG. 4 X |
| 3,808,468 | 4/1974 | Ludlow et al. | 307/304 |
| 3,906,255 | 9/1975 | Mensch, Jr. | 307/205 |
| 3,986,044 | 10/1976 | Madland et al. | 307/205 |
| 4,071,783 | 1/1978 | Knepper | 307/205 X |
| 4,110,776 | 8/1978 | Rao et al. | 357/23 |

Primary Examiner—Larry N. Anagnos
Attorney, Agent, or Firm—Arthur J. Torsiglieri

[57] ABSTRACT

An improved IGFET bootstrap driver circuit capable of driving a load impedance to substantially full VDD power supply voltage and holding the load at that voltage for an indefinite period of time. The circuit includes a load transistor, a feedback capacitor connected between the source and gate electrodes of the load transistor, a fix valued resistor connected between the gate electrode of the load transistor and an on-chip bias voltage generating circuit for providing a bias voltage greater than VDD+VT. The resistor and the bias voltage generating circuit provide sufficient current to replenish the charge lost from the feedback capacitor through junction leakage currents in the driver circuit. The resistor is of a sufficiently high value such that the current drain from the generating circuit is insignificantly small in comparison to the current drain from the VDD power supply. The improved circuit also permits the load transistor to be switched "on" or "off" by an externally applied signal.

8 Claims, 5 Drawing Figures

IGFET BOOTSTRAP CIRCUIT

BACKGROUND OF THE INVENTION

This invention relates to insulated gate field effect transistor (IGFET) logic circuits and more particularly to logic circuits which use capacitively coupled voltage feedback (bootstrapping) in their load transistor.

IGFET circuits using capacitively coupled voltage feedback from the source electrode to the gate electrode of the load transistor (bootstrap circuits) are known in the art and are commonly found in both p-channel metal-oxide-semiconductor (PMOS) and n-channel metal-oxide-semiconductor (NMOS) integrated circuits. In accordance with the bootstrap technique, a typical application of which is the prior art circuit shown in FIG. 1, the output voltage of the circuit is coupled from the output terminal to the gate of the load transistor through a capacitance which is initially charged to some voltage by a charging circuit. The bootstrap technique provides a circuit whose output can rise to substantially the full power supply (VDD power supply) voltage and one with increased output drive capability and switching speed. In addition, the bootstrap technique eliminates the need for an additional off-chip power supply otherwise necessary to bias the gate of the load transistor at a voltage sufficient to keep the load transistor in the "triode region" of its operating characteristics. Eliminating the off-chip bias supply, which must provide sizeable currents to charge the gate capacitance of the load transistor, significantly reduces the power dissipation of the circuit.

An example of a prior art circuit using the bootstrap technique as shown in FIG. 1 is described in U.S. Pat. No. 3,506,851 by R. W. Polkinghorn et al. One problem with prior art bootstrap circuits such as the one described in the Polkinghorn patent is that the output voltage cannot be maintained at VDD for long periods of time. When such a circuit is held in the "high" logic state, junction leakage currents in the transistors which are coupled to the feedback capacitance drains away the charge stored in the capacitance and causes the output voltage to shift from VDD to VDD-2 VT (VT is the threshold voltage of the transistors) in typically several milliseconds. The shifting output voltage of a bootstrap circuit may produce erroneous switching in load circuits which are driven by the output voltage, and therefore imposes greater noise immunity requirements on such load circuits.

A prior art solution to alleviate the shifting output voltage problem in bootstrap circuits is disclosed in U.S. Pat. No. 3,649,843 by D. J. Redwine et al. The Redwine patent describes a bootstrap circuit (as shown in FIG. 2) similar to the one described in the Polkinghorn patent but with the addition of a sustaining transistor connected between the output terminal and the VDD supply terminal. However, the Redwine circuit is deficient in that its steady-state output voltage for the "high" logic state is clamped to only VDD-VT rather than to VDD as is desirable. Therefore, the above-mentioned noise immunity problem is still present when low values of VDD are used. Moreover, the addition of the sustaining transistor also increases the capacitive loading on the output node and thereby decreases the switching speed of the circuit.

In many applications it is desirable from the standpoint of reducing power dissipation to use a technique called power gating whereby the load transistor of a circuit is switched to its nonconducting state ("off" state) while the circuit is in its "low" logic state. Power gating eliminates a dc current path from the VDD power supply through the load and driver transistors to ground and thus reduces the power dissipation of the circuit. Although prior art bootstrap circuits may be power gated, the above-mentioned problem of shifting output voltage limits their usefulness in such applications.

Therefore, it is clear that a need exists for an improved bootstrap circuit which would permit its output voltage to be maintained at full VDD supply voltage for indefinite periods, and also for one which can be power gated.

Accordingly, it is an object of the present invention to provide an improved bootstrap circuit in which the steady-state output voltage for the "high" logic state is maintained at substantially full power supply voltage.

It is another object of the present invention to provide an improved bootstrap circuit which can be power gated.

It is a further object of the present invention to provide an improved bootstrap circuit having low power dissipation and high switching speed.

SUMMARY OF THE INVENTION

In accordance with the principals of this invention, the above and other objects are achieved in an IGFET circuit having some aspects in common with circuits disclosed in the above-identified Polkinghorn reference including a first voltage supply terminal adapted to carry a first bias voltage, an output node, a control node, a first IGFET having its channel coupled between the first voltage supply terminal and the output node, the gate of the first IGFET being coupled to the control node, a second IGFET having its channel coupled between the first voltage supply terminal and the control node, capacitance means coupled between the output node and the control node, a second voltage supply terminal adapted to carry a second bias voltage, at least one input terminal for receiving an input signal, switching means coupled between the output node and the second voltage supply terminal, the switching means responsive to the input signal at the input terminal for providing a conducting path between the output node and the second voltage supply terminal, Characterized in that there are included a third voltage supply terminal adapted to carry a third bias voltage of greater magnitude than the first bias voltage and substantially fixed value resistance means coupled between the third voltage supply terminal and the control node.

The addition of the resistance means coupled between a third bias voltage source and the control node serves to replenish drained charge from the capacitance means without adversely affecting circuit speed nor significantly increasing power dissipation. The improved configuration also permits the circuit to be power gated through the second IGFET with the current through the second IGFET limited by the resistance means.

The above and other objects of the invention are achieved in embodiments described hereinafter. The novel features of the invention, both as to structure and method of operation, together with further objects and advantages thereof will be better understood from the following description considered in connection with the accompanying drawing. It is to be expressly understood, however, that the drawing is solely for the purpose of illustration and description and is not intended to define limits of the invention.

DETAILED DESCRIPTION

Figure 1:
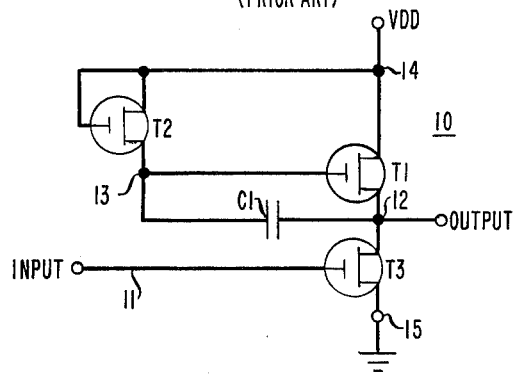
FIG. 1 is a schematic diagram of an IGFET bootstrap inverter circuit known in the prior art.

Referring now to FIG. 1, there is shown a bootstrap inverter circuit 10 known in the prior art and implemented with NMOS transistors. Generally, IGFETs have three electrodes, namely the source, the drain, and the gate. The IGFET is normally connected and biased in such a manner that when a voltage whose magnitude is greater than the magnitude of VT is applied to the gate electrode, a conducting path or channel is created between the source and drain electrodes. In most IGFETs the source and drain electrode are interchangeable and the IGFETs can be simply thought of as having a channel whose resistance is controlled by the voltage on the gate electrode. The circuit comprises a load transistor T1 having its channel connected between a VDD supply terminal 14 for providing a positive bias voltage, VDD, and an output node 12, the gate of T1 being connected to a control node 13. A capacitance C1 is connected between the output node and the control node. The channel of a clamping transistor T2 is connected between the VDD supply terminal and the control node, the gate of T2 being also connected to the VDD supply terminal. The channel of a driver transistor T3 is connected between the output node and a ground supply terminal 15 for providing ground potential, the gate of T3 being connected to an input terminal 21.

The transconductance of T3 is made large relative to that of T2 and T1 to assure that the output voltage will be substantially at ground potential when T3 is driven to its conducting state by a "high" logic level applied to the input terminal. A "high" logic level for such circuits is generally a voltage which is between VDD-VT and substantially VDD, while a "low" logic level for such circuits is substantially ground potential.

During the interval of time that T3 is in its conducting state the capacitance C1 is charged through T2 until the voltage across C1 is approximately VDD-VT. Owing to the fact that T2 is connected as a diode, T2 isolates the control node from the VDD supply terminal when the voltage on the control node exceeds VDD-VT.

When a "low" logic level is applied to the input terminal, T3 goes to its nonconducting state isolating the output node from the ground supply terminal. The output voltage is then pulled towards VDD by T1. As the output voltage rises the charge on C1 keeps the voltage between the control node and the output node relatively constant at approximately VDD-VT. This constant voltage between the gate and source electrodes of T1 keeps T1 in the "triode region" of its operating characteristics and allows the output voltage to rise to substantially VDD. When the output voltage reaches VDD, the voltage on the control node is approximately 2 VDD-VT.

Threshold voltage, VT, is defined as the voltage which must be applied between the gate and source electrodes of an IGFET to bring it to the onset of its conducting state. However, the voltage at the control node cannot be maintained at 2 VDD-VT for indefinite periods owing to the leakage current at the source to substrate junction of T2, this leakage acting to drain away charge from C1. If the inverter circuit were maintained in the "high" logic state for a sufficiently long period of time, the leakage would cause the voltage across C1 to fall below VT and T1 to turn off isolating the output node from the VDD supply terminal. Junction leakage then causes the output voltage to fall. The voltage at both the control node and the output node continue to fall until T2 clamps the control node voltage at VDD-VT and T1 clamps the output voltage at its steady-state value of VDD-2 VT. In a typical NMOS bootstrap in which VT=1.2 V and VDD=5 V, the "high" logic level shifts by nearly half the logic swing (the difference between "high" and "low" logic levels) in several milliseconds. Thus the bootstrap circuit of FIG. 1 cannot be operated under conditions where a "high" logic state has to be maintained for more than several milliseconds without encountering severe noise immunity problems.

Figure 2:
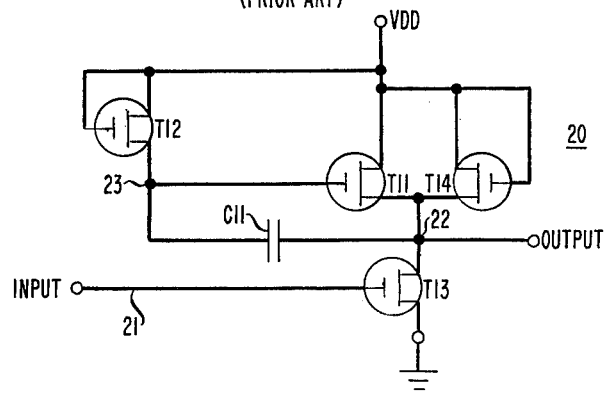
FIG. 2 is a schematic diagram of a prior art IGFET bootstrap inverter circuit including a sustaining transistor for maintaining the steady-state output voltage representing the "high" logic state at VDD-VT.

Referring now to FIG. 2, there is shown another prior art bootstrap inverter circuit 20 which includes an improvement for reducing the output voltage shift caused by junction leakage. Transistors T11, T12, and T13 and capacitance C11 form the same bootstrap inverter as described in FIG. 1. The improvement consists of the addition of a sustaining transistor T14 whose channel is connected in parallel with that of the load transistor T11 and whose gate is connected to the VDD supply terminal. When the circuit is in the "high" logic state, T14, which is connected as a diode, clamps the output voltage at VDD-VT. The transconductance of T14 is made sufficiently low such that when the circuit is in the "low" logic state, the additional current flowing through T14 does not appreciably alter the "low" logic level at the output node 22. Thus the effect of T14 is to reduce the shift in output voltage from 2 VT as in the circuit of FIG. 1 to VT.

Although the addition of a sustaining transistor yields a reduction in the output voltage shift caused by junction leakage currents, the noise immunity problem is not entirely eliminated. Inasmuch as an output voltage shift of VT (1.2 V) is significant in comparison to the logic swing (5 V), erroneous switching of load circuits driven by the output voltage can still occur. Moreover, the addition of T14 increases the capacitive loading at the output node 22 and thus decreases the switching speed of the circuit.

Figure 3:
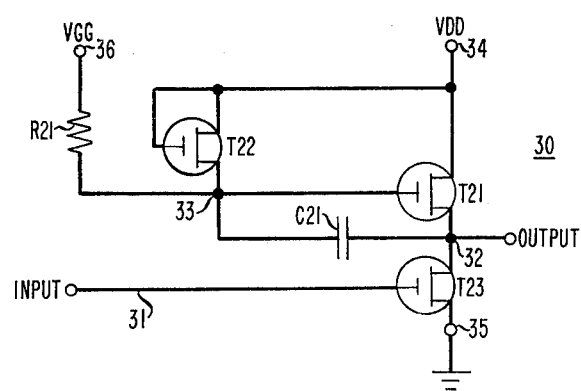
FIG. 3 is a schematic diagram of an illustrative embodiment of an IGFET bootstrap inverter circuit in accordance with the instant invention.

The output voltage shift caused by junction current leakage is virtually eliminated in the illustrative bootstrap circuit in accordance with the principles of this invention shown in FIG. 3. Referring now to FIG. 3, transistors T21, T22, T23 and capacitor C21 form the prior art bootstrap inverter circuit as described in FIG. 1. There is added a VGG supply terminal 36 for carrying a bias voltage, VGG, which is greater than VDD+VT. A high fixed-value resistance R21 is connected between the VGG supply terminal 36 and the control node 33. When the circuit is in the "high" logic state, VGG supply provides current through R21 to the control node to replenish the charge which is drained from C21 by junction leakage. Since leakage at the source junction of T22 is typically a nanoampere or less the current provided by the VGG supply need only be of the same magnitude. Thus, the value of R21 is typically of the order of a gigaohm.

In its preferred embodiment R21 is a resistor formed with an ion-implanted polycrystalline silicon (polysilicon) layer. The use of ion-implanted polysilicon resistors as circuit elements in IGFET integrated circuits is known in the prior art and is described in U.S. Pat. No. 4,110,776 by G. R. M. Rao et al. Undoped polysilicon layers can be formed having a sheet resistance as high as several gigaohms per square. The sheet resistance can be decreased by appropriately doping the polysilicon layer with ion-implantation. Owing to the very high sheet resistance that can be obtained, polysilicon layers can be advantageously used to form compact resistors having resistance values as high as several gigaohms.

Figure 5:
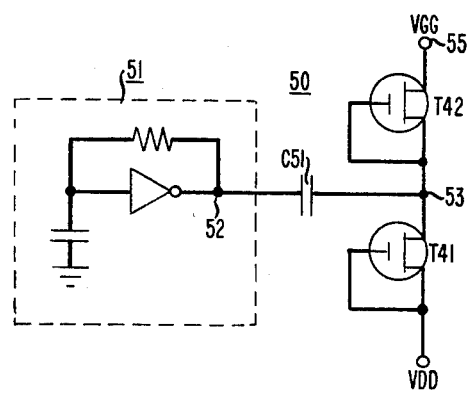
FIG. 5 is a schematic diagram of a charge pump bias voltage generating circuit.

Because the current drain on the VGG supply is very small, in the preferred embodiment of the circuit of FIG. 3, VGG is provided by a bias voltage generating circuit situated on the same semiconductor chip as the bootstrap circuit instead of by an off-chip power supply. A bias voltage generating circuit for providing VGG is illustrated in FIG. 5. Referring now to FIG. 5, there is shown a charge pump voltage doubling circuit 50 which includes a self-starting oscillator 51 for providing a square wave having a voltage swing from approximately ground potential to approximately VDD. The square wave drives one side of a capacitor C51, the other side of which is coupled to the charge pump node 53 located between two diode-connected transistors T41 and T42. Transistor T41 prevents the voltage at the charge pump node 53 from falling below VDD-VT and isolates that node from the VDD supply when its voltage rises above VDD-VT. Positive charge is pumped through T42 to the output node 55 where a large capacitive load keeps the output voltage (VGG) at a relatively constant 2 VDD-2 VT. Transistor T42 isolates the output node from the charge pump node when the voltage at the latter goes below 2 VDD-VT.

Referring again to FIG. 3, the capacitance C21 may be a separately formed capacitor with one plate connected to the output node and the other plate connected to the control node. In its preferred embodiment C21 is a capacitor which is formed by enlarging the gate electrode of T21 to overlap an extended diffused region which forms the source electrode of T21. By forming the capacitor in this manner, one plate of a capacitor is integral to the gate of T21 while the other plate of the capacitor is integral to the source electrode of T21. As is known in the prior art, it is advantageous to make the value of C21 much greater than that of stray capacitances associated with the control node to minimize the effect of charge sharing between C21 and the stray capacitances. Although the circuit of FIG. 3 is shown to be implemented with N-channel transistors, the same circuit may also be implemented using P-channel transistors by making appropriate changes in power supply voltages and in the logic levels of the input signals. These changes would be obvious to one skilled in the art of IGFET circuit design. Also, rather than using a single driver transistor (T23), switching means comprising various combinations of multiple transistors driven by multiple input signals may also be used to achieve a desired logic function for the circuit Furthermore, the ground supply terminal 35 need not be connected to ground potential but may be connected to some other value of bias voltage which is more negative than VDD.

Figure 4:
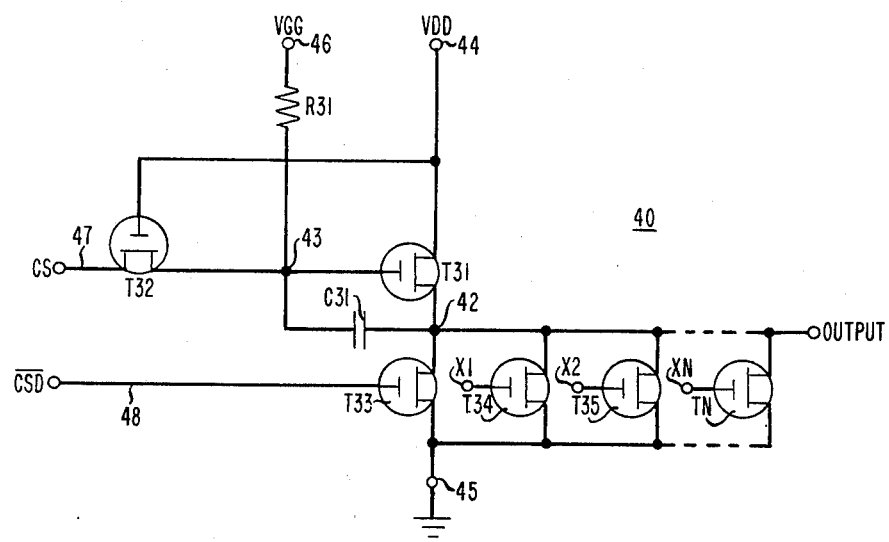
FIG. 4 is a schematic diagram of a bootstrap multi-input NOR gate including provisions for power gating in accordance with the instant invention.

In many applications, it is advantageous from the standpoint of reducing power consumption to drive the load transistor into its nonconducting state when driver transistor is in its conducting state. This technique, which eliminates a direct current path between the VDD supply and ground, is referred to as power gating. A bootstrap circuit having provisions for power gating in accordance with the principle of the present invention is illustrated in FIG. 4. Referring now to FIG. 4, there is shown a multiple input NOR gate 40 which may be used as an address decoder in a random access memory. The bootstrap load which comprises transistors T31 and T32, capacitance C31, and resistor R31 is similar to the load of the circuit of FIG. 3 except that the drain of T32 is connected to a clock input terminal 47 instead of to the VDD supply terminal. The clock input terminal receives a clock signal CS for power gating the load transistor T31. When CS is a "high" logic level approximately equal to VDD, the bootstrap load functions in the manner already described in connection with the circuit of FIG. 3. The decoder circuit can be deactivated to a standby state by making the input signal, CSD, applied to the gate of T33 a "high" logic level and by making CS a "low" logic level. While in the standby state, T33 is in its conducting state to pull the output node 42 to a "low" logic level and T31 is in its nonconducting state to isolate the output node from the VDD supply. Under these conditions, the current drain from the VGG supply through R31 and T32 to the CS signal source is only on the order of a nanoampere by virtue of the very high resistance of R31. To activate the decoder circuit CS is first made a "high" logic level. Then after a delay interval sufficient for C31 to fully charge through T32 (i.e., for the control node 43 to reach a voltage of approximately VDD-VT), CSD is made a "low" logic level to allow T33 to go to its nonconducting state. Address signals X1 to XN which are present on the gates of transistors T34 to TN respectively determine whether the output goes "high" or remains "low" via the NOR logic function of the activated circuit.

The VGG voltage may be supplied on-chip as previously discussed in connection with FIG. 4.

I claim:

1. An IGFET driver circuit comprising a first voltage supply terminal adapted to carry a first bias voltage, an output node, a control node, a first IGFET having its channel coupled between the first voltage supply terminal and the output node, the gate of the first IGFET being coupled to the control node, a second IGFET having its channel coupled between the first voltage supply terminal and the control node, capacitance means coupled between the output node and the control node, a second voltage supply terminal adapted to carry a second bias voltage, at least one input terminal for receiving an input signal, switching means coupled between the output node and the second voltage supply terminal, the switching means responsive to the input signal at the input terminal for providing a conducting path between the output node and the second voltage supply terminal, characterized in that there are included a third voltage supply terminal adapted to carry a third bias voltage of greater magnitude than the first bias voltage, and substantially fixed value resistance means coupled between the third voltage supply terminal and the control node.

2. An IGFET driver circuit as recited in claim 1 wherein the switching means comprise a third IGFET having its channel coupled between the output node and the second voltage supply terminal and its gate coupled to the input terminal.

3. An IGFET driver circuit as recited in claim 2 further characterized in that the resistance means comprise one or more polysilicon resistors.

4. An IGFET driver circuit as recited in claim 3 further characterized in that there is included a bias voltage generating circuit situated on the same substrate as the driver circuit, the generating circuit for providing the third bias voltage having a magnitude greater than that of the sum of the first bias voltage and the threshold voltage of the first EGFET.

5. An IGFET driver circuit comprising a first voltage supply terminal adapted to carry a first bias voltage, an output node, a control node, a first IGFET having its channel coupled between the first voltage supply terminal and the output node, the gate of the first IGFET being coupled to the control node, capacitance means coupled between the output node and the control node, a second voltage supply terminal adapted to carry a second bias voltage, at least one input terminal for receiving an input signal, switching means coupled between the output node and the second voltage supply terminal, the switching means responsive to the input signal at the input terminal for providing a conducting path between the output node and the second voltage supply terminal.

characterized in that there are included a third voltage supply terminal adapted to carry a third bias voltage of greater magnitude than the first bias voltage, a clock input node for receiving a clock signal, a second IGFET having its channel coupled between the control node and the clock input node, the gate of the second IGFET being coupled to the first voltage supply terminal, and substantially fixed value resistance means coupled between the third voltage supply terminal and the control node.

6. An IGFET driver circuit as recited in claim 5 wherein the switching means comprise a third IGFET having its channel coupled between the second voltage supply terminal and the output node, the gate of the third IGFET being coupled to the input terminal.

7. An IGFET driver circuit as recited in claim 6 further characterized in that the resistance means comprise one or more polysilicon resistors.

8. An IGFET driver circuit as recited in claim 7 further characterized in that there is included a bias voltage generating circuit situated on the same substrate as the driver circuit, the generating circuit for providing the second bias voltage having a magnitude greater than that of the sum of the first bias voltage and the threshold voltage of the first IGFET.

* * * * *